US008644061B2

(12) United States Patent
Hwang et al.

(10) Patent No.: US 8,644,061 B2
(45) Date of Patent: *Feb. 4, 2014

(54) VARIABLE RESISTANCE MEMORY DEVICE PERFORMING PROGRAM AND VERIFICATION OPERATION

(75) Inventors: Youngnam Hwang, Hwaseong-si (KR); Changyong Um, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 483 days.

This patent is subject to a terminal disclaimer.

(21) Appl. No.: 12/558,631

(22) Filed: Sep. 14, 2009

(65) Prior Publication Data

US 2010/0097849 A1    Apr. 22, 2010

(30) Foreign Application Priority Data

Oct. 17, 2008  (KR) .................... 10-2008-0102043

(51) Int. Cl.
*G11C 11/00*    (2006.01)
(52) U.S. Cl.
USPC .......................................... 365/163; 365/148
(58) Field of Classification Search
USPC ............... 365/185.33, 185.17, 100, 148, 163, 365/185, 46, 94, 113, 127
See application file for complete search history.

(56) References Cited

U.S. PATENT DOCUMENTS

| 6,304,486 | B1 | 10/2001 | Yano |
| 6,741,502 | B1 | 5/2004 | Cernea |
| 6,845,045 | B1 | 1/2005 | Cernea |
| 6,963,507 | B2 * | 11/2005 | Tanaka et al. ............ 365/185.28 |
| 7,376,015 | B2 * | 5/2008 | Tanaka et al. ............ 365/185.22 |
| 2004/0240269 | A1 * | 12/2004 | Cernea ...................... 365/185.12 |
| 2005/0180186 | A1 * | 8/2005 | Lutze et al. ...................... 365/53 |
| 2005/0276108 | A1 | 12/2005 | Guterman |
| 2006/0126380 | A1 | 6/2006 | Osada et al. |
| 2007/0109859 | A1 | 5/2007 | Cernea |
| 2008/0025081 | A1 * | 1/2008 | Cho et al. ...................... 365/163 |
| 2008/0055963 | A1 | 3/2008 | Lee et al. |
| 2008/0055994 | A1 | 3/2008 | Guterman |

(Continued)

FOREIGN PATENT DOCUMENTS

| CN | 1973337 A | 5/2007 |
| CN | 101057299 A | 10/2007 |

(Continued)

OTHER PUBLICATIONS

Ielmini, Daniele, et al., "Recovery and Drift Dynamics of Resistance and Threshold Voltages in Phase-Change Memories", IEEE Transactions on Electron Devices, vol. 54, No. 2, Feb. 2007, pp. 308-315.

*Primary Examiner* — Vanthu Nguyen
*Assistant Examiner* — Khamdan Alrobaie
(74) *Attorney, Agent, or Firm* — Volentine & Whitt, PLLC

(57) ABSTRACT

A variable resistance memory device includes; a memory cell array comprising a plurality of memory cells, a pulse shifter shifting a plurality of program pulses to generate a plurality of shifted program pulses, a write and verification driver receiving the plurality of shifted program pulses to provide a program current that varies with the plurality of shifted program pulses to the plurality of memory cells, and control logic providing the plurality of program pulses to the pulse shifter and the write and verification driver during a program/verification operation, such at least two write data bits are programmed to the memory cell array in parallel during the program/verification operation.

19 Claims, 16 Drawing Sheets

(56) References Cited

U.S. PATENT DOCUMENTS

| | | | |
|---|---|---|---|
| 2008/0056002 A1 | 3/2008 | Guterman | |
| 2008/0056003 A1 | 3/2008 | Guterman | |
| 2008/0074918 A1 | 3/2008 | Ro et al. | |
| 2008/0158960 A1* | 7/2008 | Sekar et al. | 365/185.09 |
| 2010/0067287 A1* | 3/2010 | Porter et al. | 365/163 |
| 2010/0103745 A1 | 4/2010 | Cernea | |

FOREIGN PATENT DOCUMENTS

| | | |
|---|---|---|
| JP | 2006155700 A | 6/2006 |
| JP | 2008084518 A | 4/2008 |
| KR | 100809333 B1 | 2/2008 |
| KR | 1020080028624 A | 4/2008 |

\* cited by examiner

VARIABLE RESISTANCE MEMORY DEVICE PERFORMING PROGRAM AND VERIFICATION OPERATION

CROSS-REFERENCE TO RELATED APPLICATION

This U.S. non-provisional patent application claims priority under 35 U.S.C. §119 to Korean Patent Application No. 2008-102043 filed on Oct. 17, 2008, the subject matter of which is hereby incorporated by reference.

BACKGROUND

The present disclosure relates to semiconductor memory devices. More particularly, the disclosure relates to variable resistance memory devices performing a program and verification operation.

Semiconductor memory devices may be generally categorized as random access memory (RAM) and read only memory (ROM). ROM is a form of nonvolatile memory capable of retaining stored data in the absence of applied power. ROM includes programmable ROM (PROM), erasable programmable ROM (EPROM), and electrically erasable programmable ROM (EEPROM) including flash memory. Flash memory may be further classified as NOR-type flash memory and NAND-type flash memory.

RAM is a volatile memory and loses stored data in the absence of applied power. RAM may be further classified as dynamic RAM (DRAM) and a static RAM (SRAM). DRAM has been used with great commercial success for many decades, and generally stores data using a conventional capacitor element. The presence of the capacitor is what makes DRAM non volatile in its operative nature.

Emerging forms of RAM seek to replace the capacitor with other elements that are nonvolatile in their operative nature. The ferroelectric RAM (FRAM) uses a ferroelectric capacitor to store data. The magnetic RAM (MRAM) uses a tunneling magneto-resistive layer to store data and phase change memory uses the material properties of certain chalcogenide alloys to store data.

Phase change memory is a form of nonvolatile memory that interprets the phase change and corresponding resistance of a thermally alterable material as respective data states. Phase change memory may readily fabricated at low cost points using a fairly simple manufacturing process.

Phase change memory typically includes a write driver circuit capable of supplying a program current to the phase change material (e.g., GST) during a program operation. The write driver circuit typically supplies the program current in one of two states; a set current or a reset current. This program current is commonly derived from an externally provided power supply voltage (e.g., 2.5V). As conventionally understood, the set current converts the phase change material to a set state and the reset current converts the phase change material to a reset state. The set and reset states correspond to respective material properties for the phase change material. The program current is applied to the phase change material at defined levels over defined periods of time to transition between states.

In order to improve reliability of a program operation in a phase change memory, a constituent program verification operation is performed ("a program/verification operation"). Phase change memory typically performs a program/verification operation by incrementally increasing the level of the program current. Each program/verification cycle conducted at a defined program current level is termed "a program loop operation", and a sequence of program loop operations is often used (or capable of being used) to effectively program a phase change memory.

SUMMARY

Embodiments of the invention provide a variable resistance memory device comprising; a memory cell array comprising a plurality of memory cells, a pulse shifter shifting a plurality of program pulses to generate a plurality of shifted program pulses, a write and verification driver receiving the plurality of shifted program pulses to provide a program current that varies with the plurality of shifted program pulses to the plurality of memory cells, and control logic providing the plurality of program pulses to the pulse shifter and the write and verification driver during a program/verification operation, such at least two write data bits are programmed to the memory cell array in parallel during the program/verification operation.

Embodiments of the invention provide also provide a memory system comprising; a microprocessor receiving write data from an input/output unit and transferring the write data to a variable resistance memory device, wherein the variable resistance memory device comprises; a memory cell array comprising a plurality of memory cells, a pulse shifter shifting a plurality of program pulses to generate a plurality of shifted program pulses, a write and verification driver receiving the plurality of shifted program pulses to provide a program current that varies with the plurality of shifted program pulses to the plurality of memory cells, and control logic providing the plurality of program pulses to the pulse shifter and the write and verification driver during a program/verification operation, such at least two write data bits are programmed to the memory cell array in parallel during the program/verification operation.

BRIEF DESCRIPTION OF THE DRAWINGS

The accompanying figures are included to provide a further understanding of certain embodiments of the invention. In the figures.

DESCRIPTION OF EMBODIMENTS

Embodiments of the invention will be described below in some additional detail with reference to the accompanying drawings. The present invention may, however, be embodied in different forms and should not be construed as being limited to only the illustrated embodiments. Rather, these embodiments are presented as teaching examples. Throughout the drawings and written description, like reference numbers and labels are used to refer to like or similar elements.

A phase change memory is used throughout the description that follows as an example of a broader class of variable resistance memory devices. Embodiments of the invention encompass the entire class of variable resistance memory devices and are not limited to only phase change memory.

Figure 1:
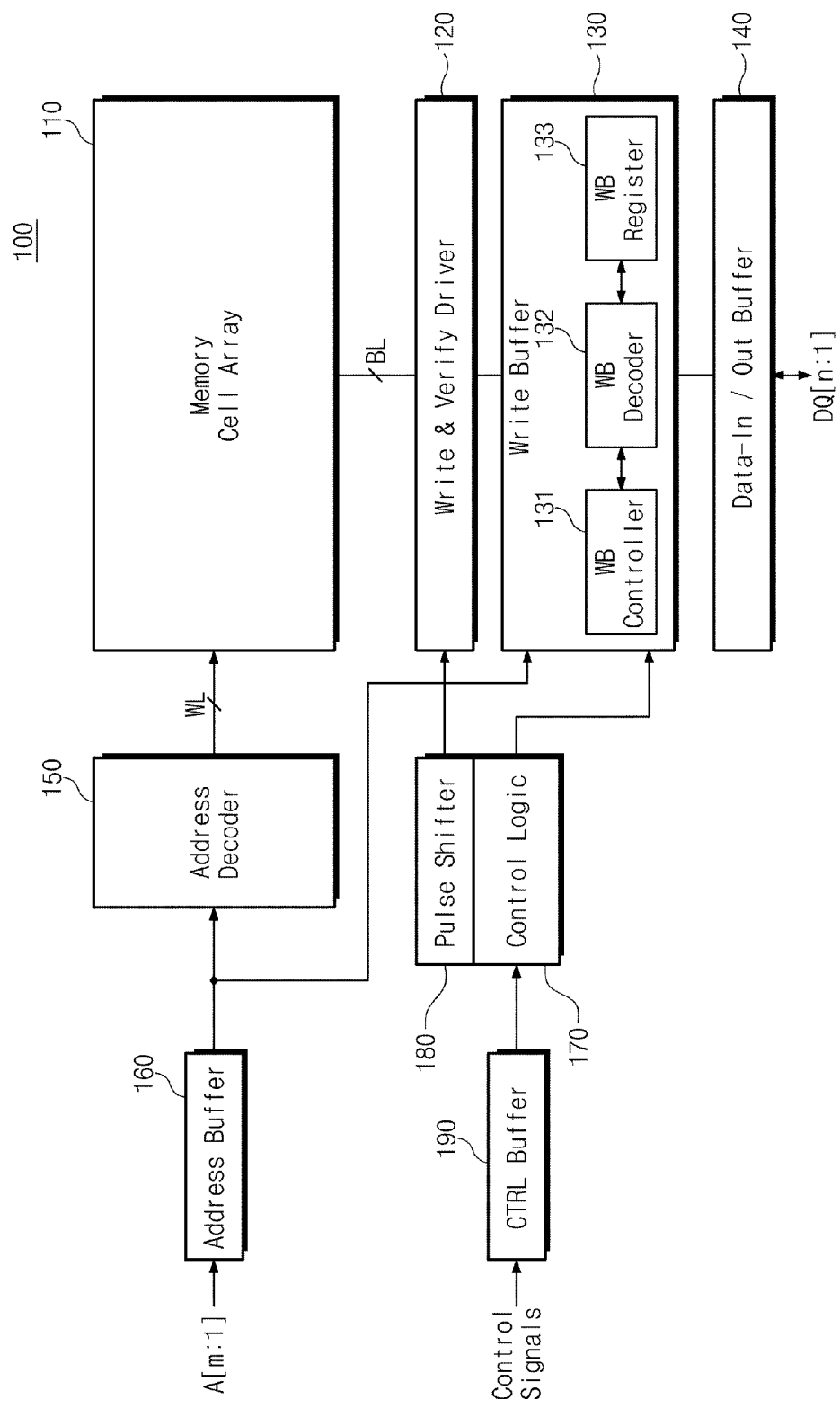
FIG. 1 is a block diagram of a variable resistance memory device according to an embodiment of the invention.

FIG. 1 is a block diagram of a variable resistance memory device according to an embodiment of the invention. Referring to FIG. 1, a variable resistance memory device 100 includes a memory cell array 110, a write and verification driver 120, a write buffer 130, a data input/output buffer 140, an address decoder 150, an address buffer 160, a control logic 170, a pulse shifter 180 and a control buffer circuit 190. According to the illustrated embodiment of a variable resistance memory device, the entire interval required to perform a program/verification operation may be reduced, and peak current consumed during the program/verification operation may also be reduced.

The memory cell array 110 is assumed to include a plurality of phase change memory cells (not shown). Each memory cell comprises of a memory element and a select element. It is the memory element that includes the phase change material. The select element may take many different forms but may be implemented using an NMOS transistor or a diode. The phase change material is further assumed to be a material that varies its states (and corresponding resistance) in relation to an applied temperature. Such materials are well known in the art and include such variable resistance materials as Ge—Sb—Te or GST.

The phase change material may exist in one of two stable states; a crystal state and an amorphous state, depending on the applied temperature and its application period. The phase change material transitions between the crystalline state and the amorphous state depending on a (thermal energy inducing) current supplied via a bit line (BL). Thus, the exemplary variable resistance memory device 100 programs data using the materials property characteristics of the phase change material described above.

The write and verification driver 120 receives a program pulse, a verification pulse and data and provides a program current and a verification current to a bit line (BL) of the memory cell array 110. Here, the program pulse may be a set pulse or a reset pulse. Accordingly, the program current may be a set current or a reset current. The write and verification driver 120 provides set current inducing set pulse when write data to be written to a memory cell is "0", and provides a reset current inducing reset pulse when the write data is "1".

The address buffer 160 temporally stores an address signal A[m:1] and subsequently transfers the address signal A[m:1] to the write buffer 130 and the address decoder 150. The address decoder 150 provides a word line (WL) signal to the memory cell array 110.

The pulse shifter 180 provides a plurality of program pulses and verification pulses according to an embodiment of the present invention to the write and verification driver 120 in response to a control of the control logic 170. The pulse shifter 180 provides the plurality of program pulses and verification pulses to the write and verification driver 120 by shifting the program pulses and verification pulses so that the plurality of program pulses and verification pulses is not synchronized with each other respectively.

The control buffer circuit 190 temporally stores a control signal and transmits the control signal to the control logic 170.

The data input/output buffer 140 outputs read data DQ[n:1] retrieved from the write buffer 130 or inputs write data DQ[n:1] received from an external device to the write buffer 130.

The control logic 170 controls the write buffer 130 and the pulse shifter 180 in response to a control signal transmitted from the control buffer 190.

The write buffer 130 temporally stores write data to be written through the write and verification driver 120 and read data to be output. The write buffer 130 may thus be used as data cache. When the write buffer 130 stores data being accessed from the control logic 170, the write buffer 130 outputs data via the data input/output buffer 140.

In certain embodiments of the invention, the write buffer 130 may include a write buffer controller 131, a write buffer decoder 132 and a write buffer resister 133.

The write buffer controller 131 determines whether data being accessed by an external device is currently located in the memory cell array 110 or the write buffer 130. If data being accessed exists in the write buffer 130, the write buffer controller 131 outputs the data being mapped through the write buffer decoder 132 to the data input/output buffer 140. Data accessed from the write buffer decoder 132 and data corresponding to the data accessed from the write buffer decoder 132 are mapped.

The write buffer resister 133 temporally stores a command provided by the control logic 170, data DQ[n:1] and transferred via the data input/output buffer 140 and an address signal A[m:1] transferred via the address decoder 150.

Generally, the variable resistance memory device 100 does not simultaneously program all of the bits of a 16 bit data block (i.e., DQ[16:0]) in order to save program operation time and reduce peak program current. Thus, 16 bit data may be sequentially programmed over eight (8) time periods, two bits at a time, or it may be sequentially programmed over four (4) time periods, four bits at a time. Such program approaches are commonly referred to as an ×2 I/O method and an ×4 I/O method.

Within this background context, the variable resistance memory device 100 according to the illustrated embodiment of the invention performs a program/verification operation. An exemplary program/verification operation for the variable resistance memory device 100 is assumed to program 16 bit data DQ[16:0] with all 16 data bots being input in parallel. During this program/verification operation, the corresponding program pulses are controlled by the pulse shifter 180 so as not to be synchronized with each other. Thus, when the program/verification operation is performed according to an embodiment of the invention, the variable resistance memory device is able to program the constituent data faster and with reduced peak current.

Figure 2:
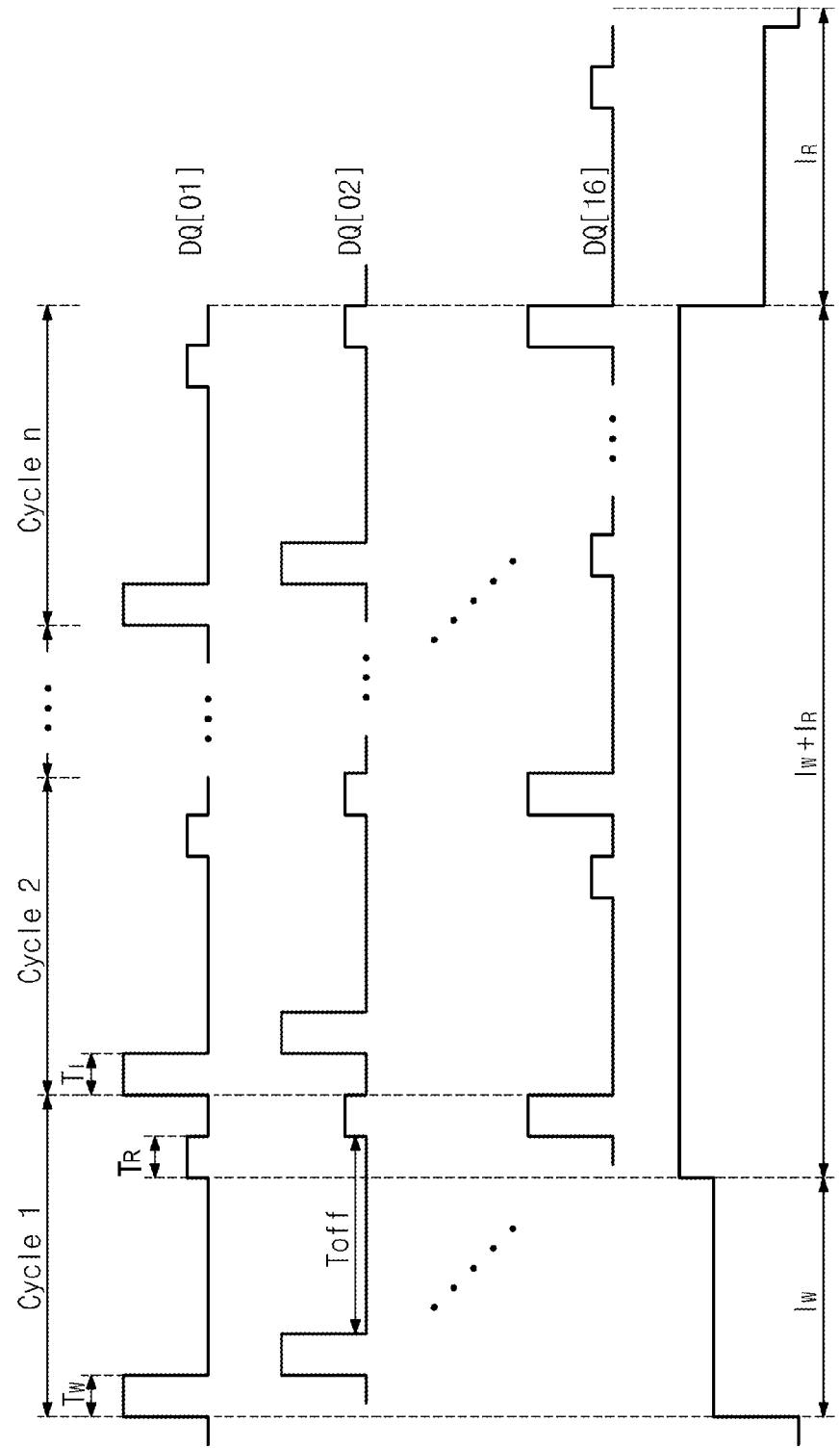
FIG. 2 is a timing diagram depicting a program/verification operation according to an embodiment of the invention.

FIG. 2 is a timing diagram depicting a program/verification operation according to an embodiment of the invention.

Referring to FIG. 2, the timing from a first cycle through an "nth" cycle is depicted. Each cycle comprises a program time ($T_W$), an OFF-time ($T_{off}$), a verification time ($T_R$) and an initial time ($T_I$).

The program time ($T_W$) is a time period wherein a program current corresponding to a program pulse is applied to a phase change material of a selected memory cell. The OFF-time ($T_{off}$) is a time period wherein the phase change material is able to change state (i.e., settle its state) so as to exhibit a predetermined corresponding resistance as the result of the program operation.

Figure 3:
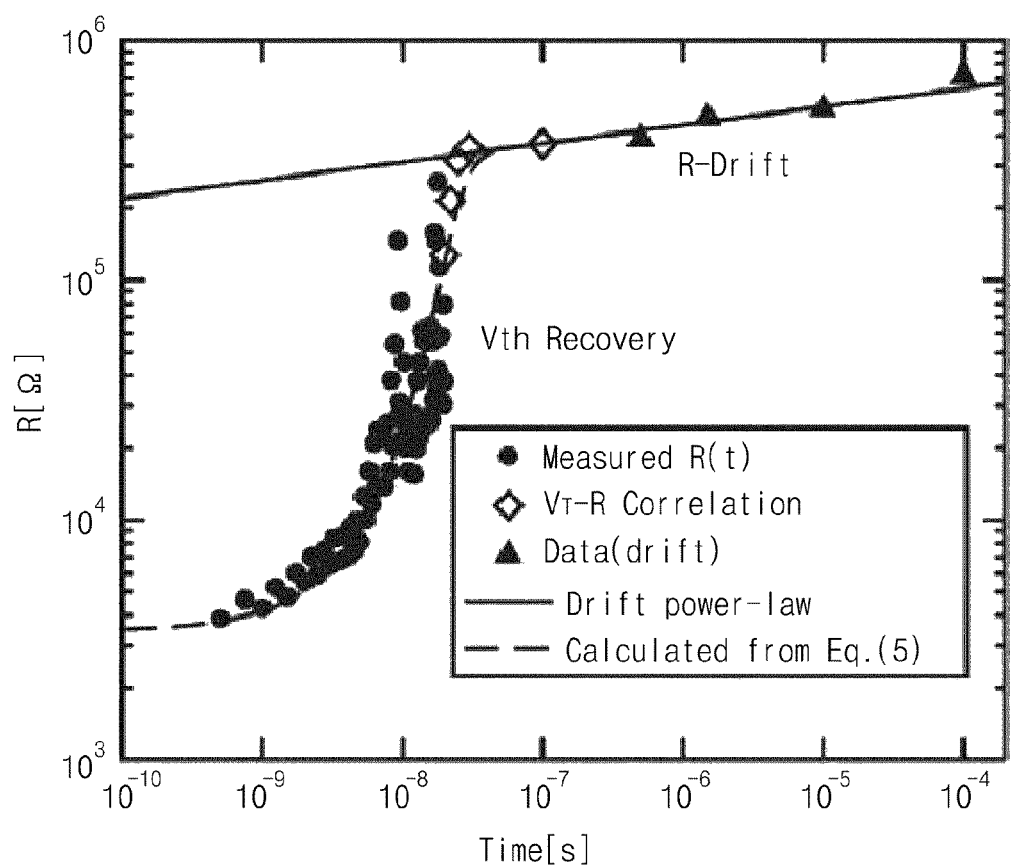
FIG. 3 is a graph correlating resistance over time for a phase change material.

FIG. 3 is a graph depicting the time required for an exemplary phase change material to reach a predetermined materials state. Referring to FIG. 3, the resistance of an assumed GST phase change material abruptly changes before 500 ns and is slowly changes after 500 ns. Thus, a corresponding OFF-time ($T_{off}$) according to one embodiment of the invention is around 500 ns.

The verification time ($T_R$) is a time period during which it is determined whether or not the program operation has been normally completed. If the target data (i.e., the write data value to be written to the memory cell) is not properly programmed during a previous program loop cycle, a next program loop cycle is performed after modifying (i.e., increasing or decreasing) the program pulse.

The initial time ($T_I$) is a time period during which preparation is made for a next program loop cycle in a program/verification operation following completion of a current program/verification operation.

Referring to FIGS. 1 and 2, the pulse shifter 180 temporally adjusts the plurality of program pulses little by little so that the plurality of program pulses is not synchronized. Therefore, a program/verification operation applied to the variable resistance memory device 100 is capable of programming the 16 bit data DQ[16:0] described above.

As depicted in FIG. 2, peak current consumption during the program/verification operation of the variable resistance memory device 100 occurs as a sum of the program current ($I_W$) and verification current ($I_R$).

Figure 4:
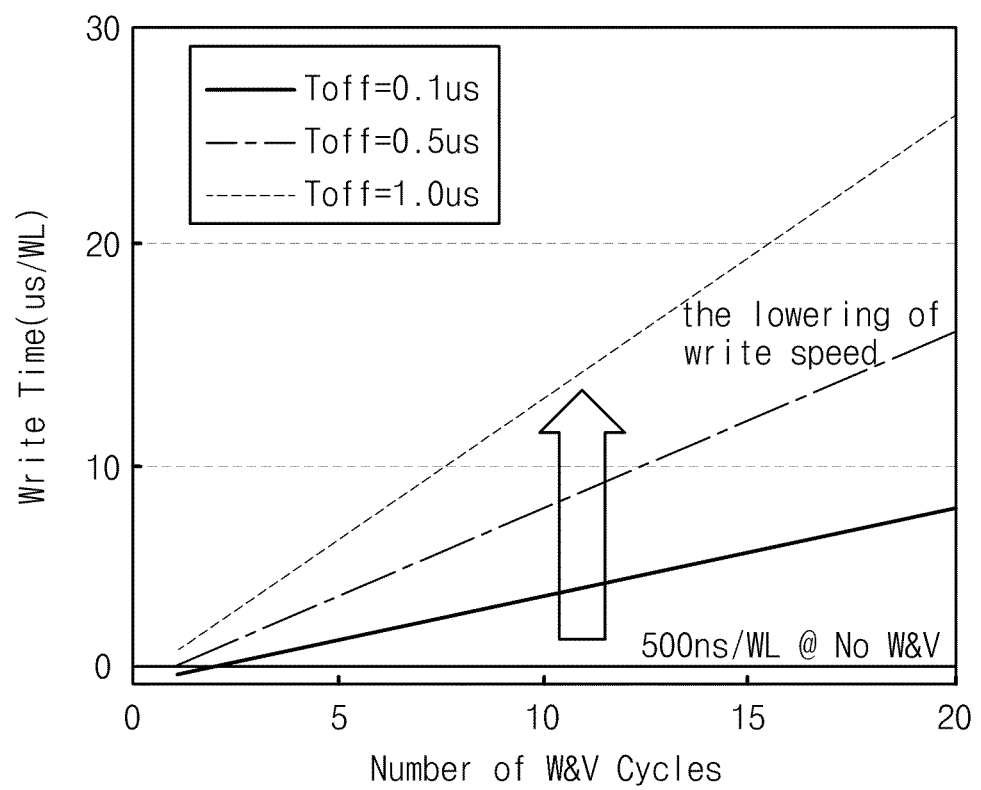
FIG. 4 is a graph depicting write time as a program/verification operation is sequentially performed.
Figure 5:
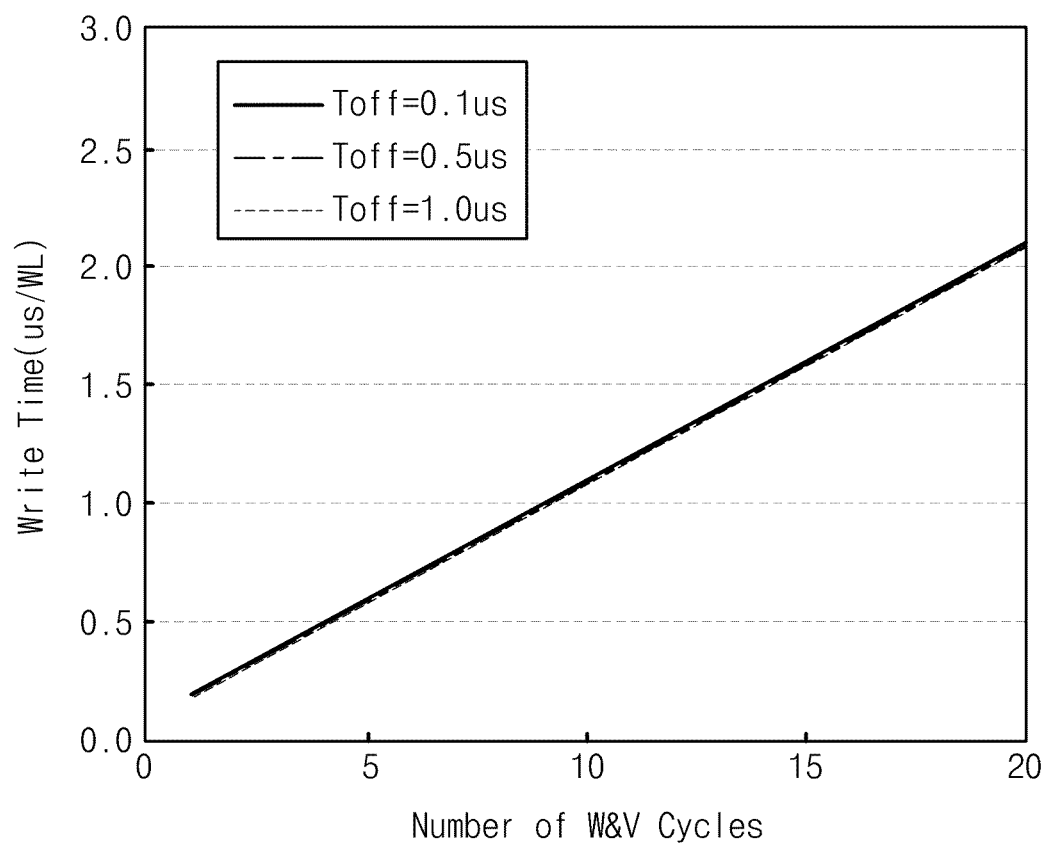
FIG. 5 is a graph depicting write time as a program/verification operation according to an embodiment of the invention is performed.

FIG. 4 is a graph depicting write time for a conventional program/verification operation as it sequentially performed through a number of program loop cycles (V&W cycles). In contrast, FIG. 5 is a graph depicting write time for a program/verification operation according to an embodiment of the invention under similar conditions.

As shown in FIG. 4, as the OFF-time ($T_{off}$) increases in the conventional program/verification operation, the overall write time also increases. However, as shown in FIG. 5, even though the OFF-time ($T_{off}$) increases, the overall write time of the program/verification operation according to an embodiment of the invention is not materially changed. Thus, the write time is not affected by the OFF-time ($T_{off}$), but is affected by the number of a program loop cycles required to properly program write data.

Figure 6:
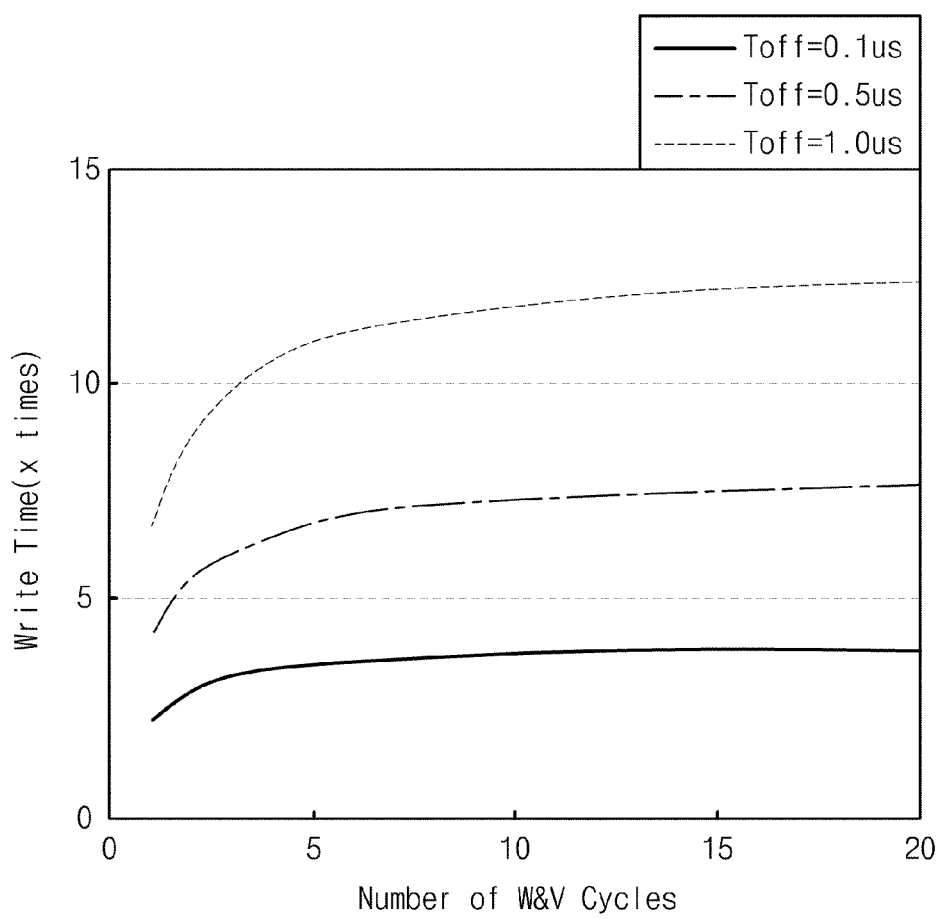
FIG. 6 is a graph depicting an increasing rate of write velocity versus a number of program/verification operations performed according to an embodiment of the invention.

FIG. 6 is a graph showing an increasing rate of a write velocity versus a number of a program loop cycles according to an embodiment of the invention. Referring to FIG. 6, as the OFF-time ($T_{off}$) increases, the increasing rate of write velocity decreases.

Figure 7:
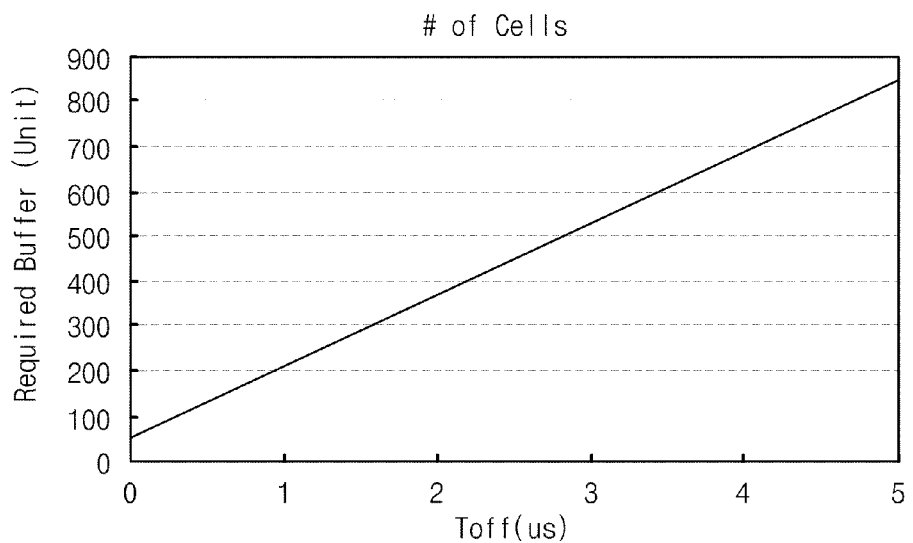
FIG. 7 is a graph depicting a number of buffer memory units required to perform a program/verification operation according to an embodiment of the invention.

FIG. 7 is a graph depicting a number of required buffer memory units for performing a program/verification operation according to an embodiment of the invention as a function of OFF-time ($T_{off}$). Since a program/verification operation is clearly a function of the number of input data bits applied in parallel during a program/verification operation according to an embodiment of the present invention, some additional memory buffering is required. As shown in FIG. 7, for example, when the OFF-time ($T_{off}$) is about 500 ns, the amount of buffer memory required for a program/verification operation according to an embodiment of the present invention is 128 bits.

Figure 8:
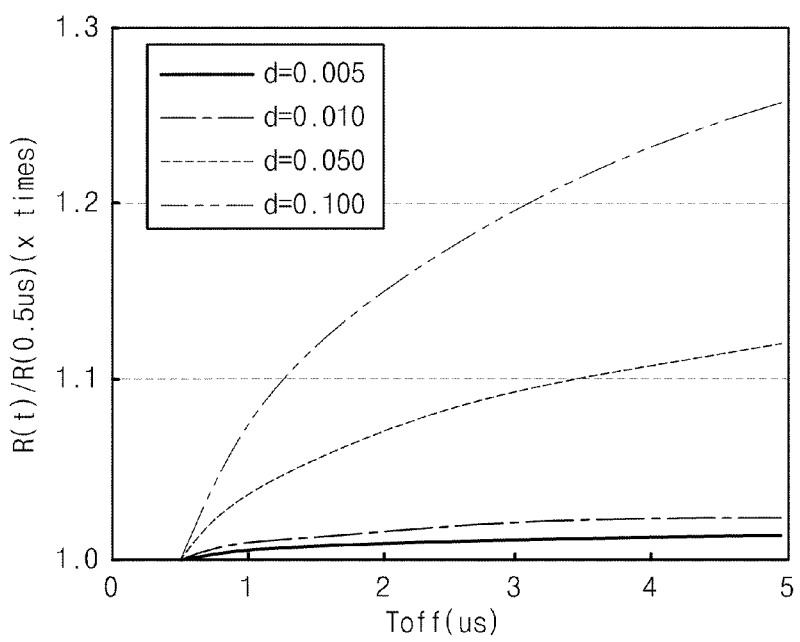
FIG. 8 is a graph depicting an increase in resistance in relation to an increase in the OFF time in a program/verification operation according to an embodiment of the invention.

FIG. 8 is a graph depicting an increase in resistance according to an increase of the OFF-time ($T_{off}$) during a program/verification operation according to an embodiment of the invention. In FIG. 8, as the OFF-time ($T_{off}$) increases, the resistance of R-drift increases according to the following formula.

$$R(T)=R(T_0)*(T/T_0)^d$$

Referring to FIGS. 7 and 8, as the OFF-time ($T_{off}$) increases, the amount of buffer memory required also increases. However, an increase in the resistance by a drift according to an increase of the OFF-time ($T_{off}$) is low.

A variable resistance memory device according to an embodiment of the invention may sequentially perform a number program loop cycles with the overall program/verification operation. Thus, the variable resistance memory device requires some additional buffer memory. However, as the time required to perform the program/verification operation is reduced, peak current consumption during the program/verification operation is reduced as well.

FIGS. 9 through 16 are graphs depicting certain methods of performing a program/verification operation according to embodiments of the invention.

Figure 9:
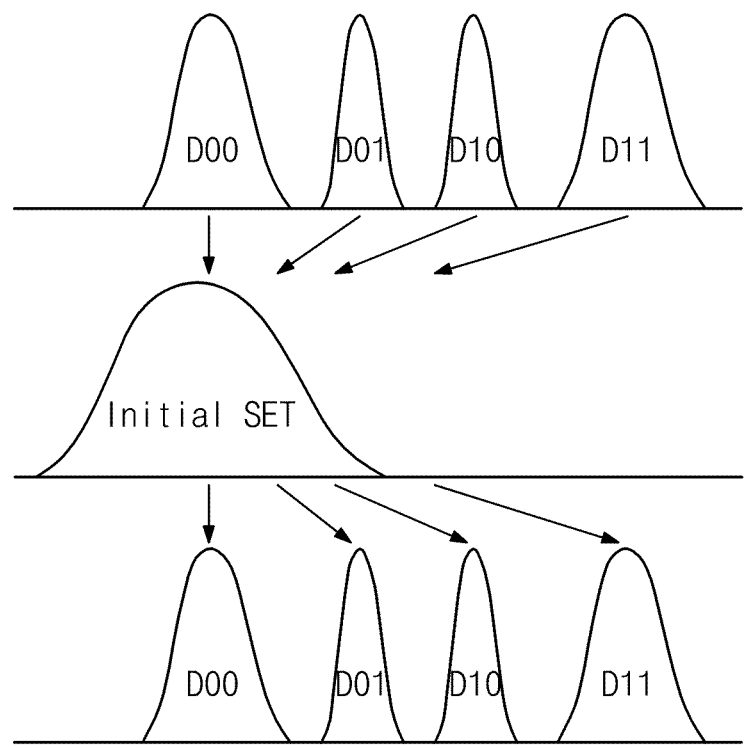
FIGS. 9 through 16 are graphs depicting methods enabling various program/verification operations according to embodiments of the invention.
Figure 10:
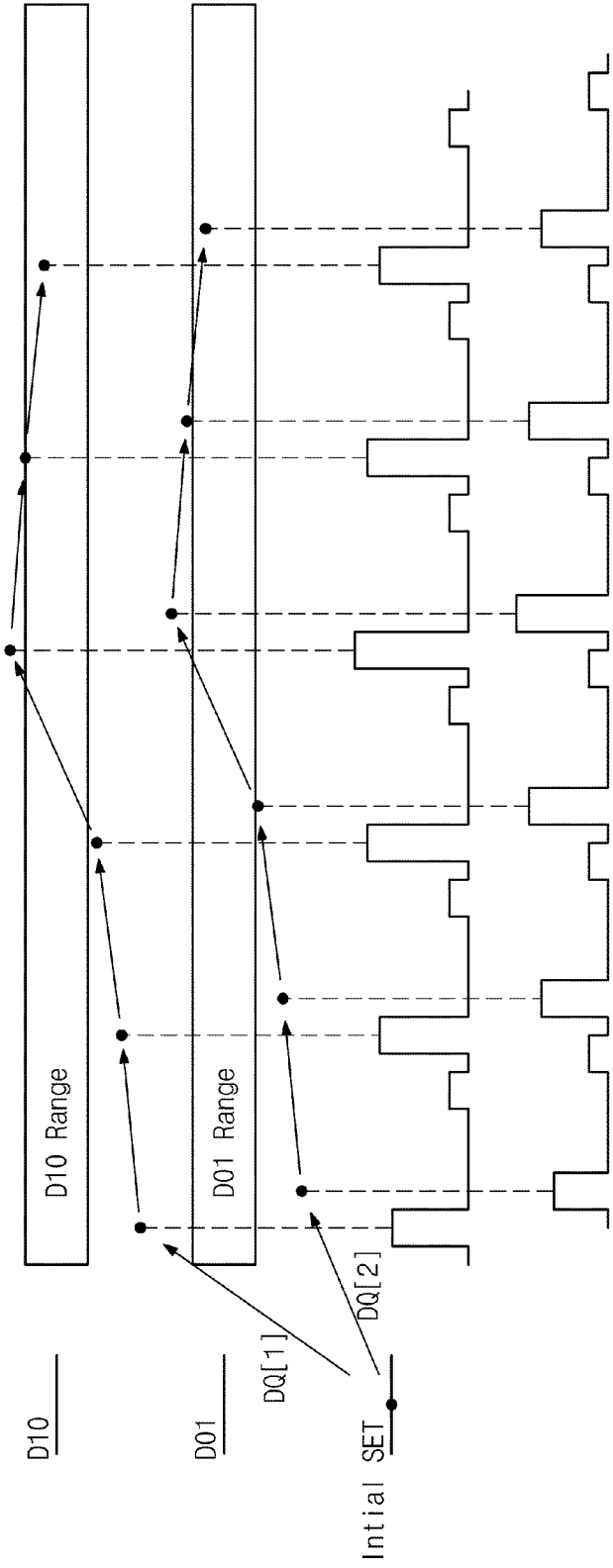

FIGS. 9 and 10 depict one method of changing a variable resistance memory cell to an initial set state as a middle step and updating data so as to update the variable resistance memory cell. Referring to FIGS. 9 and 10, the variable resistance memory device according to an embodiment of the invention updates data after passing through an initial set state which is a middle step so as to update a variable resistance memory cell.

For example, as depicted in FIG. 10, the variable resistance memory device according to an embodiment of the invention performs a program and verification operation from an initial set state to D10 state so as to update a first data DQ[1]. Also, the variable resistance memory device according to the illustrated embodiment performs a program/verification operation from an initial set state to D01 state so as to update a second data DQ[2] in parallel.

Figure 11:
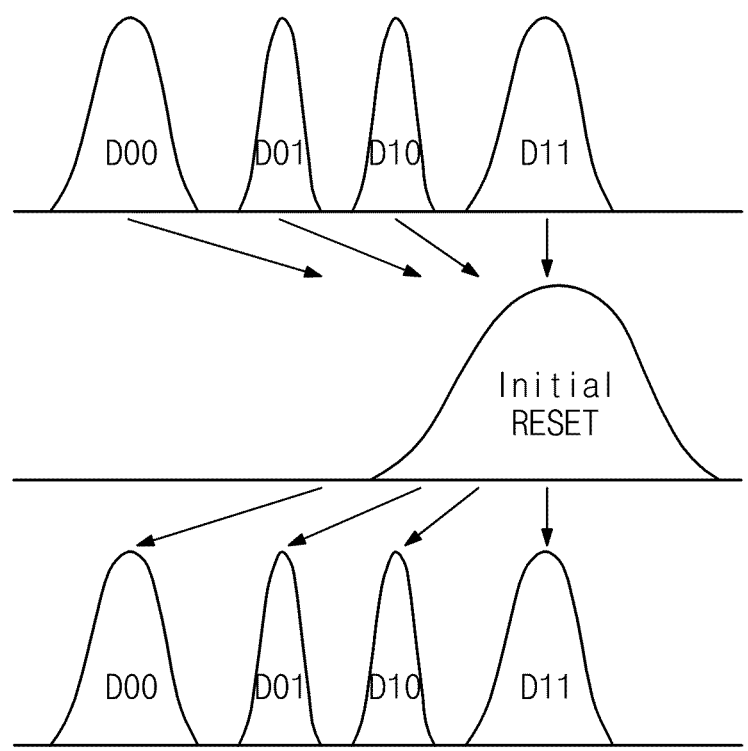
Figure 12:
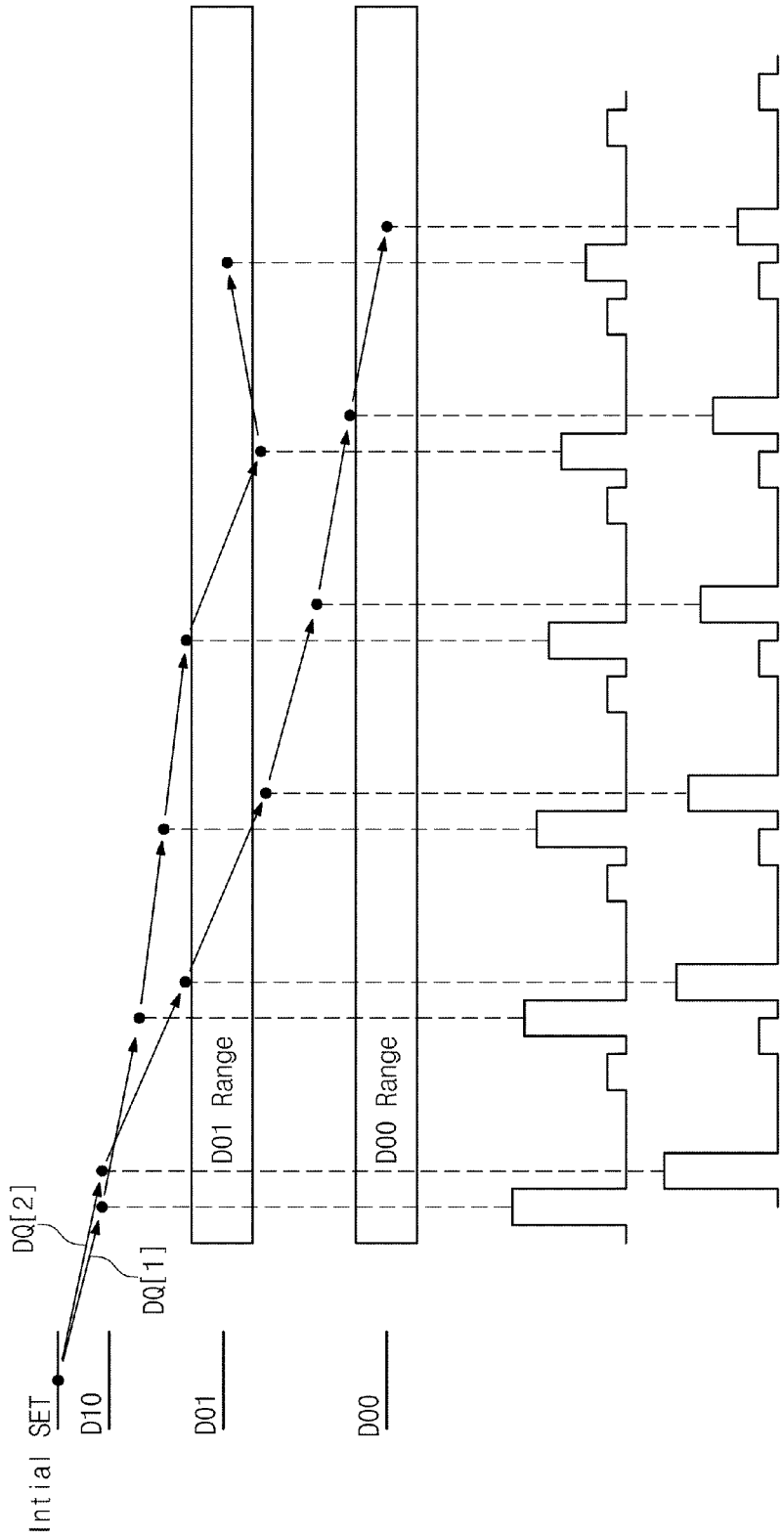

FIGS. 11 and 12 depict a method of changing a variable resistance memory cell to an initial reset state as a middle step and updating data so as to update the variable resistance memory cell.

Referring to FIGS. 11 and 12, the variable resistance memory device according to an embodiment of the invention updates data after passing through an initial reset state which is a middle step so as to update a variable resistance memory cell. For example, as depicted in FIG. 12, the variable resistance memory device of the illustrated embodiment performs a program/verification operation from an initial reset state to D01 state so as to update a first data DQ[1]. Also, the variable resistance memory device according to the illustrated embodiment performs a program/verification operation from an initial reset state to D00 state so as to update a second data DQ[2] in parallel.

Figure 13:
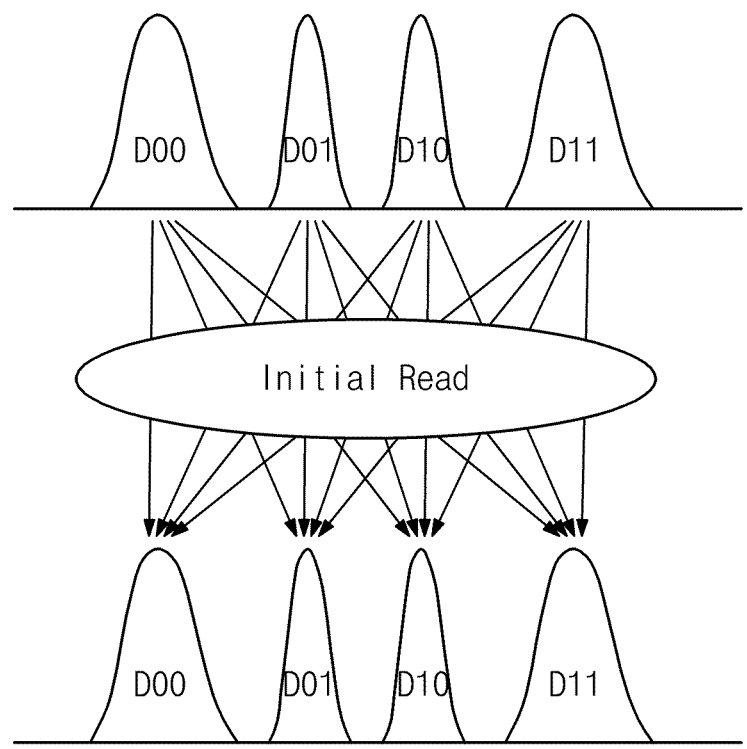
Figure 14:
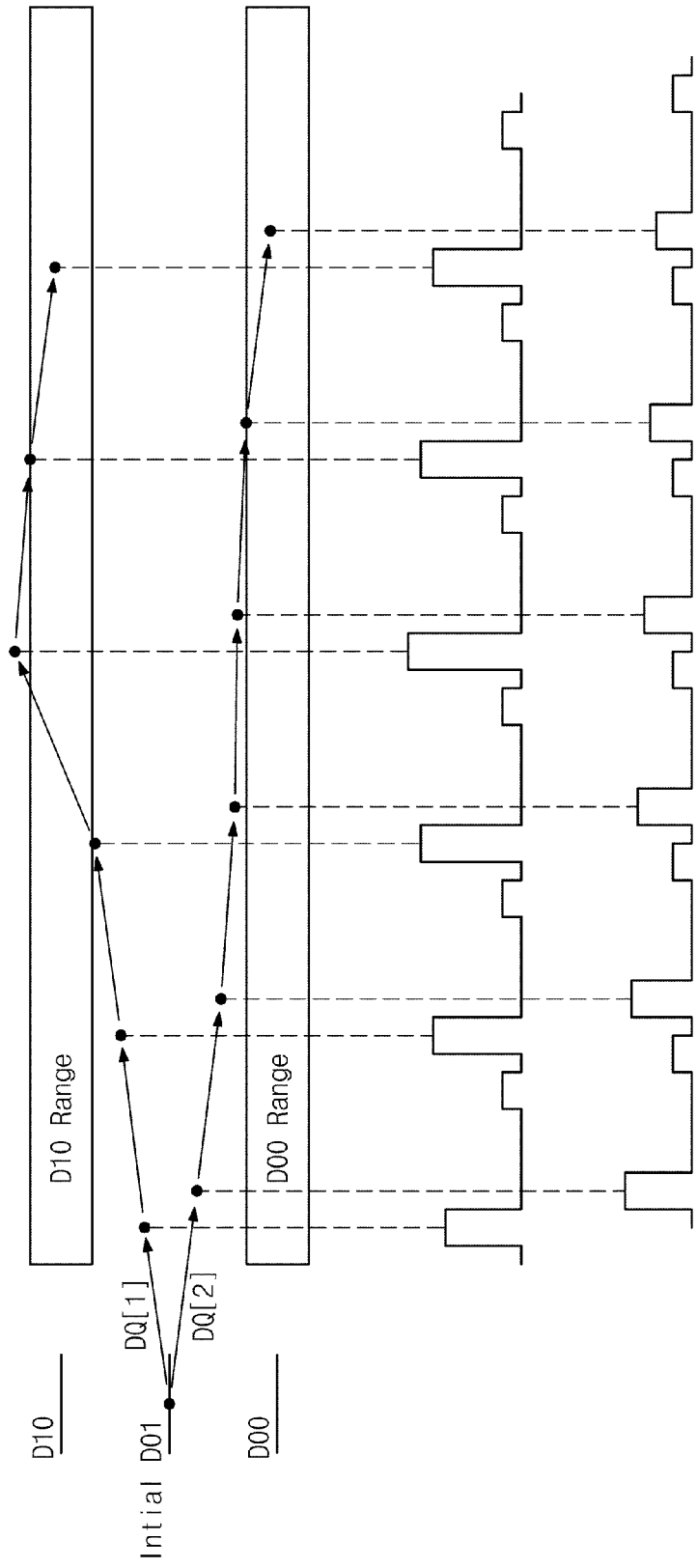

FIGS. 13 and 14 depict a method of reading the current state of a variable resistance memory cell as a middle step and updating data from an initial state so as to update the variable resistance memory cell. Referring to FIGS. 13 and 14, the variable resistance memory device of the illustrated embodiment reads a current state of a variable resistance memory cell as a middle step and updates inputted data on the basis of the current state of the variable resistance memory cell so as to update the variable resistance memory cell. For example, as depicted in FIG. 14, if it is assumed that a current state of the variable resistance memory device is D01, the variable resistance memory device performs a program/verification operation from D01 state to D10 state, so as to update a first data DQ[1]. Also, the variable resistance memory device according to the illustrated embodiment performs a program/verification operation from D01 state to D00 state so as to update a second data DQ[2] in parallel.

Figure 15:
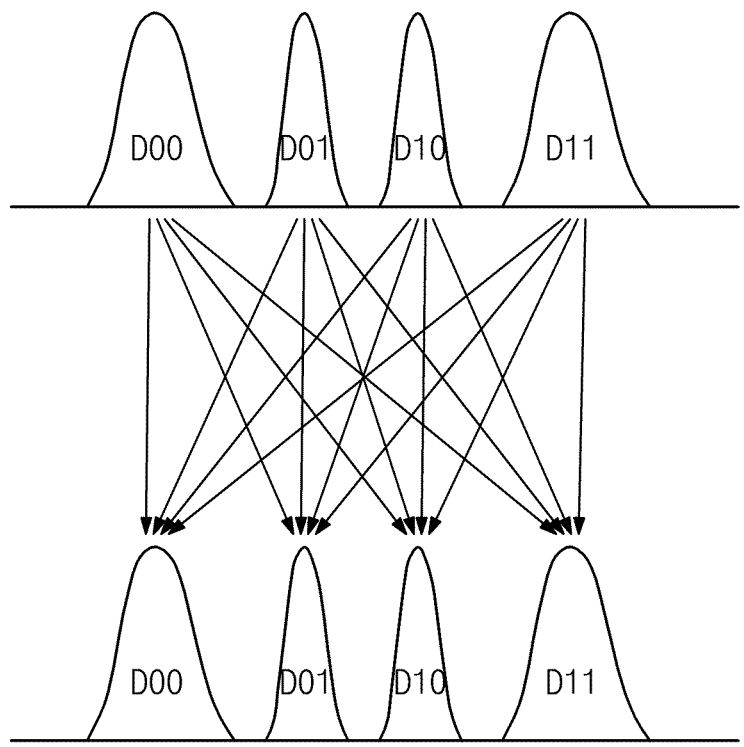
Figure 16:
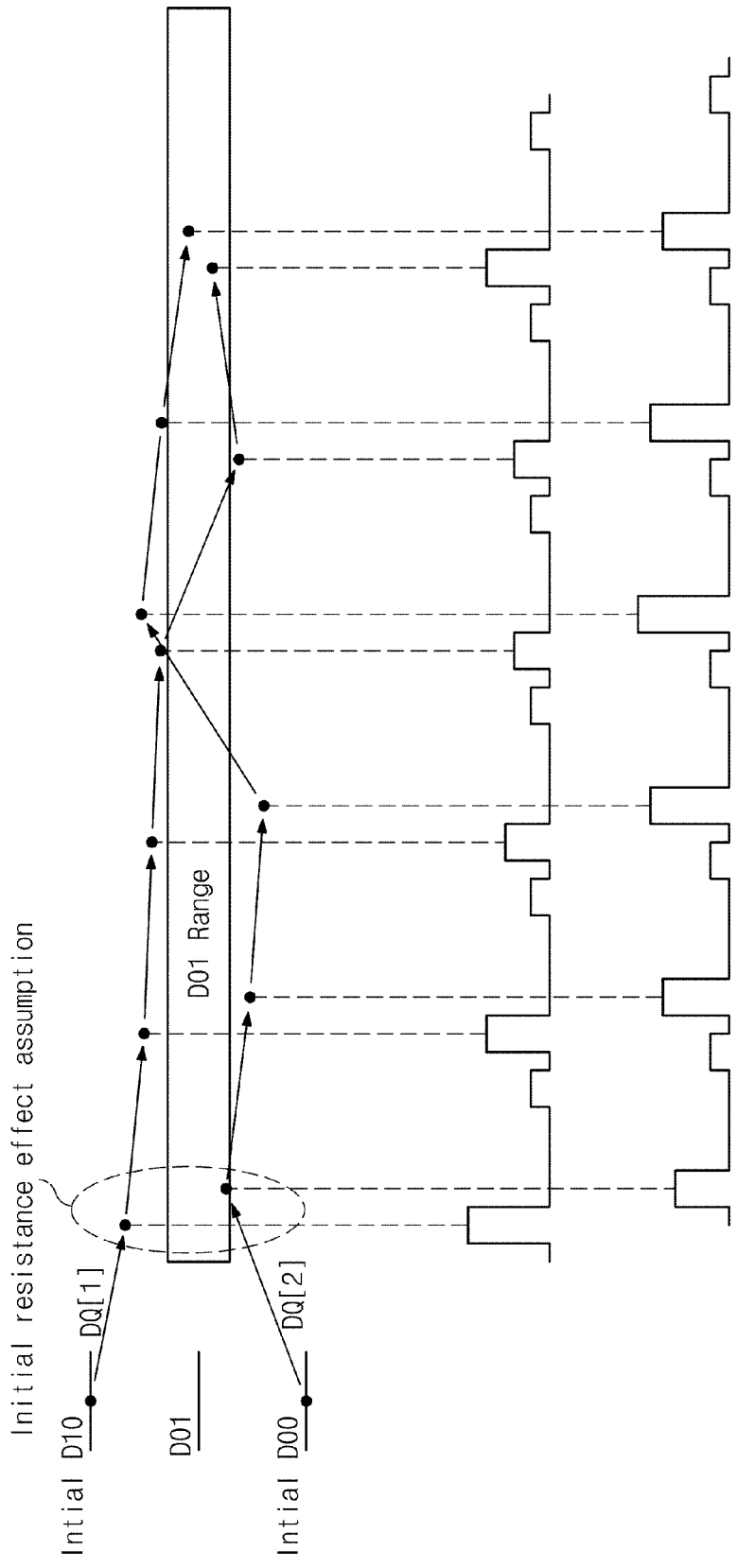

FIGS. 15 and 16 depict a method of updating data of a variable resistance memory cell without passing through a middle step so as to update the variable resistance memory cell. Referring to FIGS. 15 and 16, the variable resistance memory device according to the illustrated embodiment updates data input to the variable resistance memory cell without passing through a middle step so as to update the variable resistance memory cell. For example, as depicted in FIG. 16, if it is assumed that a current state of a variable resistance memory cell is D10, the variable resistance memory device according to the illustrated embodiment performs a program/verification operation from D10 state to D01 state so as to update a first data DQ[1]. Also, if it is assumed that a current state of a variable resistance memory cell is D00, the variable resistance memory device according to the illustrated embodiment performs a program/verification operation from D00 state to D01 state so as to update a second data DQ[2] in parallel.

As a consequence of the foregoing, a variable resistance memory device 100 according to an embodiment of the invention is able to reduce overall program time, and a program current consumption is also reduced by omitting an unnecessary program loop cycle.

Figure 17:
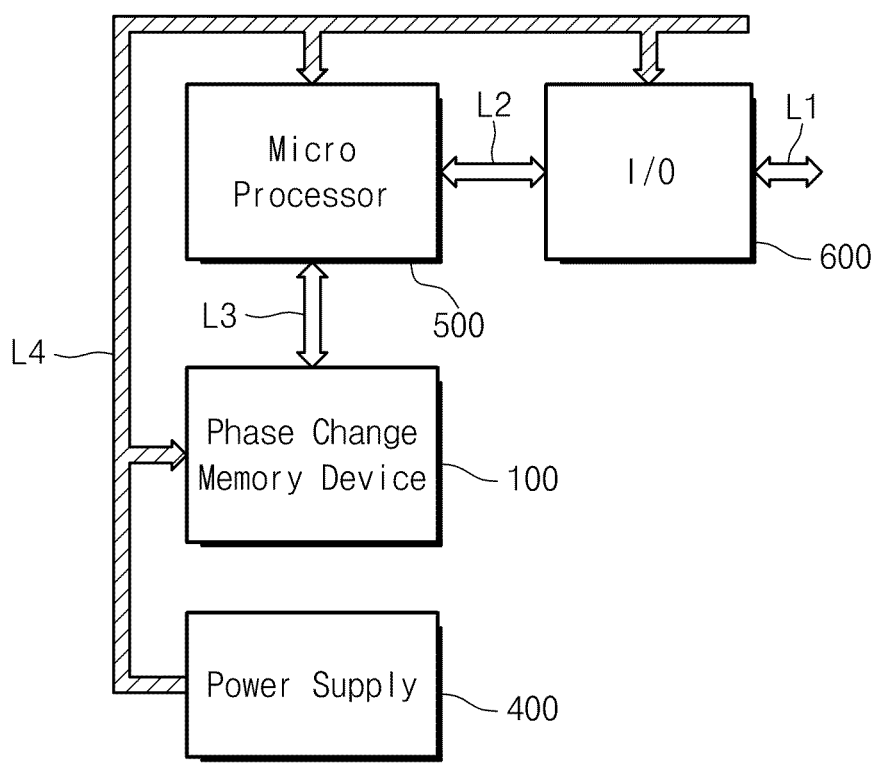
FIG. 17 is a block diagram of a portable electronic system including a variable resistance memory device according to an embodiment of the invention.

FIG. 17 is a general block diagram of a portable electronic system including a variable resistance memory device according to an embodiment of the invention. A variable resistance memory device 100 connected to a microprocessor through a bus line (L3) functions as a main memory of a portable electronic system. A battery 400 supplies a power supply to the microprocessor 500, an input/output device 600 and the variable resistance memory device 100 through a power supply line (L4).

When a received data is provided to the input/output device 600 through a line (L1), the microprocessor 500 receives the received data through a line (L2) and treats the received data, and then applies the received data or the treated data to the variable resistance memory device 100 through the bus line (L3). The variable resistance memory device 100 stores data received through the bus line (L3) in a memory cell. Also, data stored in a memory cell is read by the microprocessor 500 and outputted to the external device through the input/output device 600.

Even when a power supply of the battery 400 is not supplied to the power supply line (L4), data stored in a memory cell of the variable resistance memory device 100 remains valid due to the nonvolatile nature of the variable resistance material. This is because the variable resistance memory device 100 is a nonvolatile memory but may operate in the place of a conventional DRAM. The variable resistance memory device 100 is additionally advantageous in that its operating speed is relatively high, yet power consumption is relatively low compared with other types of memory devices.

The foregoing is illustrative of the present invention and is not to be construed as limiting thereof. Although a few embodiments of the invention have been described, those skilled in the art will readily appreciate that many modifications are possible in the embodiments without materially departing from the novel teachings and advantages of the present invention. Accordingly, all such modifications are intended to be included within the scope of the invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A variable resistance memory device comprising:
   a memory cell array comprising a plurality of memory cells;
   a pulse shifter shifting a plurality of program pulses to generate a plurality of shifted program pulses, wherein the program pulses are for programming a respective plurality of write data bits in the plurality of memory cells;
   a write and verification driver receiving the plurality of shifted program pulses to provide respective program currents that vary in accordance with the plurality of shifted program pulses to the plurality of memory cells; and
   control logic providing the plurality of program pulses to the pulse shifter and the write and verification driver during a program/verification operation, such that at least two write data bits among the plurality of write data bits are programmed to the memory cell array in parallel during the program/verification operation,
   wherein the pulse shifter shifts the program pulses so that the program pulses of respective memory cells of the memory cell array are not synchronized with each other.

2. The variable resistance memory device of claim 1, wherein the pulse shifter receives a plurality of verification pulses with the plurality of program pulses, respectively, and generates a corresponding plurality of shifted verification pulses.

3. The variable resistance memory device of claim 2, wherein the plurality of shifted program pulses and the plurality of shifted verification pulses are not synchronized with each other.

4. The variable resistance memory device of claim 3, wherein the control logic provides the plurality of verification pulses to the pulse shifter and the write and verification driver during the program operation.

5. The variable resistance memory device of claim 1, wherein each one of the plurality of memory cell is a phase change memory cell configured to store a plurality of data bits.

6. The variable resistance memory device of claim 1, wherein the program current is incrementally increased or decreased during the program/verification operation.

7. The variable resistance memory device of claim 1, further comprising:
   a write buffer temporally storing read data retrieved from the memory array and write data to be programmed to the memory cell array via the write and verification driver.

8. The variable resistance memory device of claim 7, further comprising:
   a data input/output buffer transferring the write data from an external device and transferring the read data to the external device.

9. The variable resistance memory device of claim 8, wherein the write and verification driver provides read data to data input/output buffer.

10. A memory system comprising:
    a microprocessor receiving write data from an input/output unit and transferring the write data to a variable resistance memory device,
    wherein the variable resistance memory device comprises:
    a memory cell array comprising a plurality of memory cells;

a pulse shifter shifting a plurality of program pulses to generate a plurality of shifted program pulses, wherein the program pulses are for programming a respective plurality of write data bits in the plurality of memory cells;

a write and verification driver receiving the plurality of shifted program pulses to provide respective program currents that vary in accordance with the plurality of shifted program pulses to the plurality of memory cells; and control logic providing the plurality of program pulses to the pulse shifter and the write and verification driver during a program/verification operation, such that at least two write data bits among the plurality of write data bits are programmed to the memory cell array in parallel during the program/verification operation, wherein the pulse shifter shifts the program pulses so that the program pulses of respective memory cells of the memory cell array are not synchronized with each other.

11. The memory system of claim 10, wherein the pulse shifter receives a plurality of verification pulses with the plurality of program pulses, respectively, and generates a corresponding plurality of shifted verification pulses.

12. The memory system of claim 11, wherein the plurality of shifted program pulses and the plurality of shifted verification pulses are not synchronized with each other.

13. The memory system of claim 12, wherein the control logic provides the plurality of verification pulses to the pulse shifter and the write and verification driver during the program operation.

14. The memory system of claim 10, wherein each one of the plurality of memory cell is a phase change memory cell configured to store a plurality of data bits.

15. The memory system of claim 10, wherein the program current is incrementally increased or decreased during the program/verification operation.

16. The memory system of claim 10, further comprising:
a write buffer temporally storing read data retrieved from the memory array and write data to be programmed to the memory cell array via the write and verification driver.

17. The memory system of claim 16, further comprising:
a data input/output buffer transferring the write data from an external device and transferring the read data to the external device.

18. The memory system of claim 1, wherein each of the program pulses is either one of a set pulse and a reset pulse.

19. The memory system of claim 1, wherein each of the program pulses is either one of a set pulse and a reset pulse.

* * * * *